United States Patent
Ulriksson et al.

(10) Patent No.: US 7,650,561 B1
(45) Date of Patent: Jan. 19, 2010

(54) METHOD OF SWITCHING FROM PARALLEL TO SERIAL MAP DETECTOR

(75) Inventors: Bengt A. Ulriksson, Milford, MA (US); Richard D. Barndt, San Diego, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 755 days.

(21) Appl. No.: 11/484,462

(22) Filed: Jul. 11, 2006

Related U.S. Application Data

(60) Provisional application No. 60/595,511, filed on Jul. 12, 2005.

(51) Int. Cl.
*H03M 13/03* (2006.01)

(52) U.S. Cl. .................. 714/795; 714/794; 714/796; 714/780; 375/341; 375/262

(58) Field of Classification Search ......... 714/794–796, 714/780; 375/341, 262; 365/230.01, 230.02
See application file for complete search history.

(56) References Cited

U.S. PATENT DOCUMENTS

| 5,748,887 A | * | 5/1998 | Kim et al. ............... 714/52 |
| 2002/0071332 A1 | * | 6/2002 | Nishiyama et al. ..... 365/230.01 |
| 2005/0117519 A1 | * | 6/2005 | Kwak et al. ............ 370/236 |

* cited by examiner

*Primary Examiner*—Guy J Lamarre
(74) *Attorney, Agent, or Firm*—Westman, Champlin & Kelly, P.A.

(57) ABSTRACT

A MAP detector system operates in a parallel mode for on-the-fly operations and in a serial mode for error recovery operations. In the parallel mode, a plurality of Viterbi operators process a block of input sampled data in parallel. In the serial mode a selected forward Viterbi operator and two associated reverse Viterbi operators process the entire block of data, in order, to produce soft decision data.

8 Claims, 4 Drawing Sheets

METHOD OF SWITCHING FROM PARALLEL TO SERIAL MAP DETECTOR

CROSS-REFERENCE TO RELATED APPLICATIONS

The present application claims the benefit of U.S. Provisional Patent Application Ser. No. 60/595,511, which was filed on Jul. 12, 2005, by Bengt Ulriksson et al. for a METHOD OF SWITCHING FROM PARALLEL TO SERIAL MAP DETECTOR FOR ERROR RECOVERY OF PATHOLOGICAL DATA PATTERNS and is hereby incorporated by reference.

BACKGROUND OF THE INVENTION

1. Field of the Invention

This invention relates to the switching of a real-time parallel maximum a posteriori ("MAP") detector to a serial MAP detector when the MAP detector is subjected to near pathological data.

2. Background Information

A disk drive requires a detector for the purpose of removing intersymbol interference (ISI). The MAP detector improves on a simple Viterbi detector by providing soft information i.e., reliability data is provided for each decision. A basic MAP detector consists of two Viterbi operators, which calculate the accumulated path metrics for each state. The first Viterbi operator traverses a state diagram trellis in the forward direction and the second Viterbi operator does the same in the reverse direction. The state metrics from the two operators are then added and the combined metrics are separated into two groups. The first group corresponds to a '0' incoming bit and the second group is associated with a '1' bit. The minimum metric within each group is found and the two values are subtracted to obtain the soft decision.

The basic MAP detector is highly impractical as the state metrics for a whole block have to be stored before they can be combined, which not only requires a large amount of high speed storage, but also necessitates non-real-time operations. A practical MAP detector was disclosed by Viterbi, where the single reverse Viterbi operator was replaced by two reverse Viterbi operators. Each reverse operator alternates between a learning phase and a converged phase. The learning phase starts with all metrics set to 0 (equally probable) and is followed by processing of a fix amount of input data. The length of the input data is equal to the convergence length in bits (C) in each phase. In turn, C is related to the constraint length of the channel. The Viterbi operators have, in general, converged to the correct trellis path at the end of the learning phase. Accordingly, the metrics provided during the converged phase are, in general, equivalent to the metrics obtained by a reverse Viterbi operator operating across the full block of data.

A disk drive requires a very high processing speed which is difficult to provide by means of a single, i.e., serial, detector. Current forward Viterbi detectors are based on half-rate detector technology, which is not applicable to a MAP detector as the output values would be joint probabilities for two bits. It is thus necessary to use a parallel detector.

The basis of such a detector is to alternate between two Viterbi operators for the forward Viterbi detection using the same converged phases for the reverse operators. A parallel system is described in a co-pending application Ser. No. 11/409,684, entitled PARALLEL MAXIMUM A POSTERIORI DETECTORS WITH FORWARD AND REVERSE VITERBI OPERATORS HAVING DIFFERENT CONVERGENCE LENGTHS ON A SAMPLED DATA SEQUENCE filed Apr. 24, 2006, which is assigned to a common assignee and incorporated herein in its entirety. A typical parallel detector is made up of N (typically 4) sets of two forward and two reverse Viterbi operators. Within each set a forward operator first trains on a stream of input data of length C and then produce metrics for the next, or second, length C sequence of the input data. At the same time, a reverse operator trains on a reversed copy of a third length C sequence of input data, followed by calculating the metrics from a reversed copy of the second sequence. A "metric reversal stack" is then used to transform the order of the reverse metrics to match the forward metrics such that they can be combined. At the same time that the first pair of operators is producing metrics, the second pair is training on subsequent data. The detector provides data with a fixed latency if the offset between the data set is exactly N*C input samples, i.e., each detector "leapfrogs" to keep up with the parallel input data rate.

The longitudinal disk drive channel has no response at 0 frequency (DC) and very little response at the Nyquist frequency. At the Nyquist rate, alternating 1 and 0 data patterns thus provide no or very small input signals at the detector, making it difficult to obtain correct decisions. These data patterns are known as "pathological data." Pure pathological data are normally removed by a modulation code applied to the data before it is recorded on the disk drive. However, near pathological data may not be removed by the modulation code. The channel input response to near pathological data is such that the performance is more sensitive to degradations in the forward operators. Pure pathological data during the learning phase of the forward operators will make it impossible for the detector to converge to the correct path, leading to significant degradation of the detector performance. This is evident when the performance of the parallel detector is compared to a serial detector in which the forward Viterbi operators are never restarted from an unknown state, as they are in the parallel detectors. Experiments have shown that the parallel detector, however, is especially sensitive to near-pathological patterns. A typical example being a block consisting of repeated sequences of 0x055550 (hexadecimal).

The MAP detector and iterative decoder can be operated in two different modes. The first mode is the on-the-fly mode where the detector processes the input data once and passes the result onto a decoder in real-time. The second mode is an error recovery mode, where the input samples are stored in the sample buffer and the detector and the decoder jointly process the block multiple times, with information passing not only from the detector to the decoder but also from the decoder to the detector. The MAP detector operates on the data in parallel in both modes, and each Viterbi operator resets appropriately to operate on the next data sequence supplied to the operator. In error recovery mode, the relatively short data sequences of length C used in the Viterbi operators may render the detector incapable of correcting the number of bits involved in a near-pathological situation. While these events are relatively rare, they can result in a sector being labeled bad because of a failure to converge.

SUMMARY OF THE INVENTION

The invention resolves the problems encountered in a near pathological data situation by switching from the normal parallel MAP detector mode to a serial error recovery mode in which a single serial forward Viterbi operator and its two associated reverse Viterbi operators process an entire block of data, e.g., 5000 bits. The MAP detector does not operate in real-time in the serial error recovery mode, and the serial operation is slower than the prior parallel error recovery operations. However, with the relatively rare occurrence of a near pathological data situation, the serial operations on an entire block occur seldom enough that the speed of the system is governed by the speed of the on-the-fly parallel MAP arrangement.

The invention further resolves the problems without requiring extensive alterations to the parallel MAP arrangement and without affecting the internal data paths of the detector. The system uses an addressing scheme that provides to the serially operating Viterbi operators, that is, the operators in use for the error recovery operation, input data sequences of length C that are consecutive in the buffered data block. With sequential data sequences, the serially-operating forward Viterbi operator is not reset, but otherwise operates in the same manner as it does during the parallel on-the-fly operations. Thus, the forward Viterbi operator processes the entire block of data as an extended sequence. The associated reverse Viterbi operators still process input data sequences of length C, which requires periodic resetting of the metrics in the reverse operators. The need to store reverse metrics for the whole block is thus avoided. The impact on performance is slight, as the nature of the head-media partial response signal is such that the forward Viterbi operator contributes a greater share of the combined metric. As discussed in more detail below, the addressing scheme is simplified by supplying particular data to the non-selected Viterbi operators, that is, the Viterbi operators that are not included in the serial operations—although the results produced by the non-selected Viterbi operators are not used. Accordingly, the addressing scheme supplies data to these other operators in a manner that simplifies the overall addressing operations during the serial error recovery mode.

More specifically, the system includes a state machine that operates the addressing system in a particular manner during the serial mode and otherwise returns the operations to the parallel mode. The state machine controls the addressing of buffer memory locations during the serial mode using an increment phase and a decrement phase, with the increment phase occurring at least during the clock cycles in which the serial-operating Viterbi operators are supplied data and the decrement phase occurring during clock cycles in which the serial-operating Viterbi operators are processing the data. The decrement phase essentially returns the address "count" to one that corresponds to a next C length sequence to be supplied, in order, to the selected Viterbi operators. During the latter part of the increment phase and throughout the entire decrement phase, data are supplied to the non-selected Viterbi operators, that is, to the operators that are not otherwise included in the serial error recovery operations. The MAP detector thus operates in the serial error recovery mode with the addition of a relatively small amount of memory addressing logic, to allow for the decrementing of the address count, and without requiring a change in the MAP detector's internal data paths.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
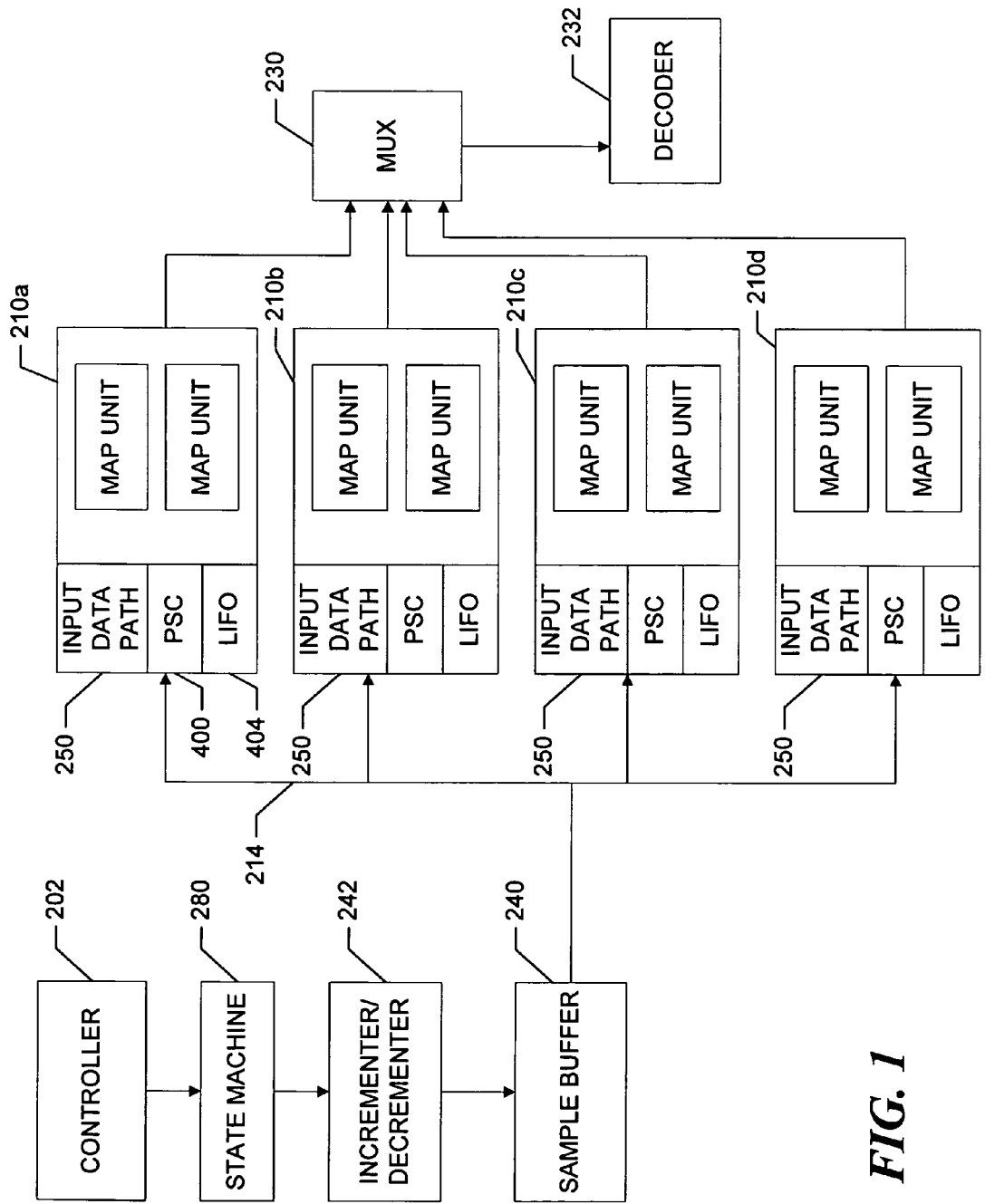
FIG. 1 is a partial diagram of a MAP detector system modified for serial operation.
Figure 2A:
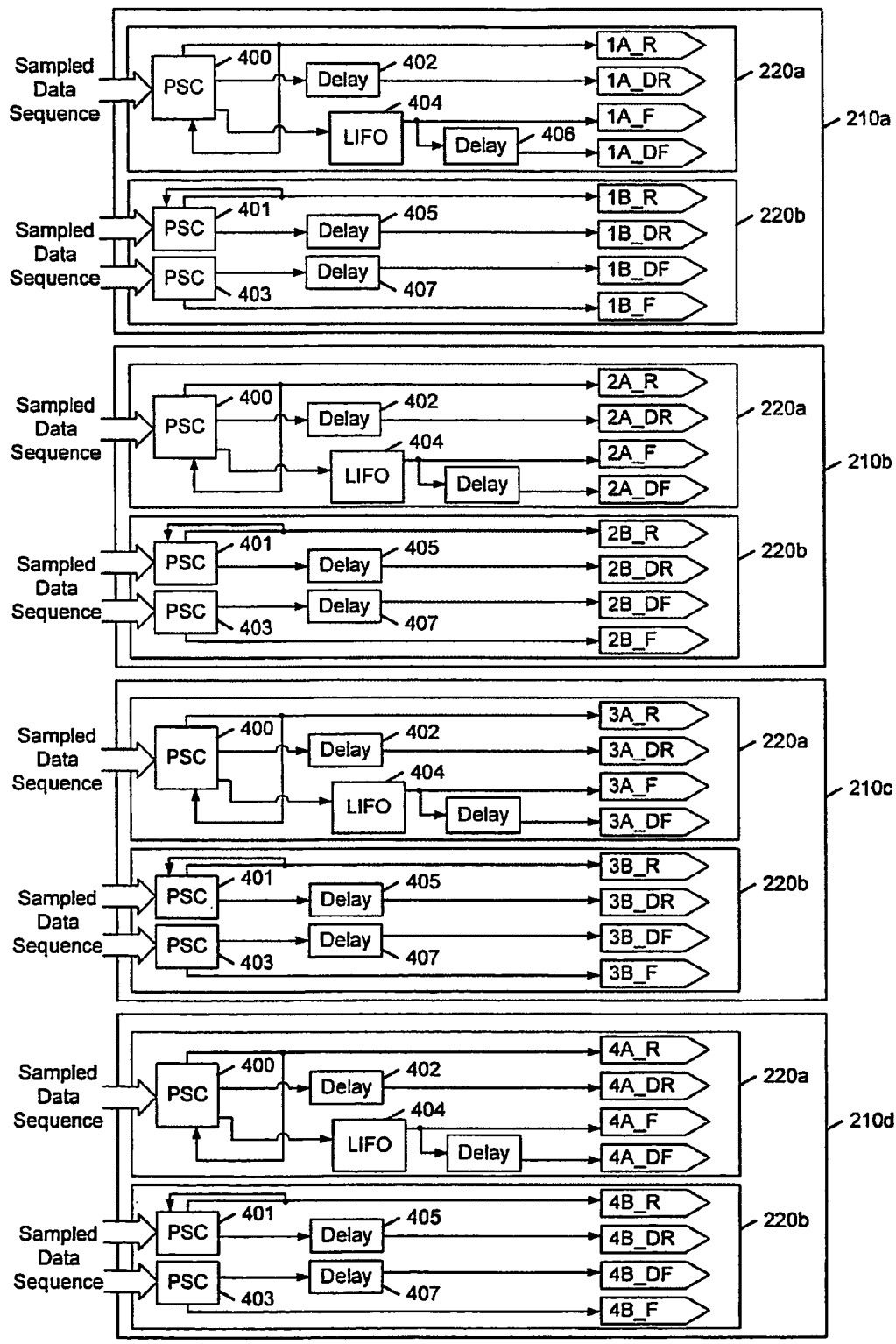
FIGS. 2a and 2b are together a more detailed diagram MAP detector units included in the MAP detector system of FIG. 1.
Figure 2B:
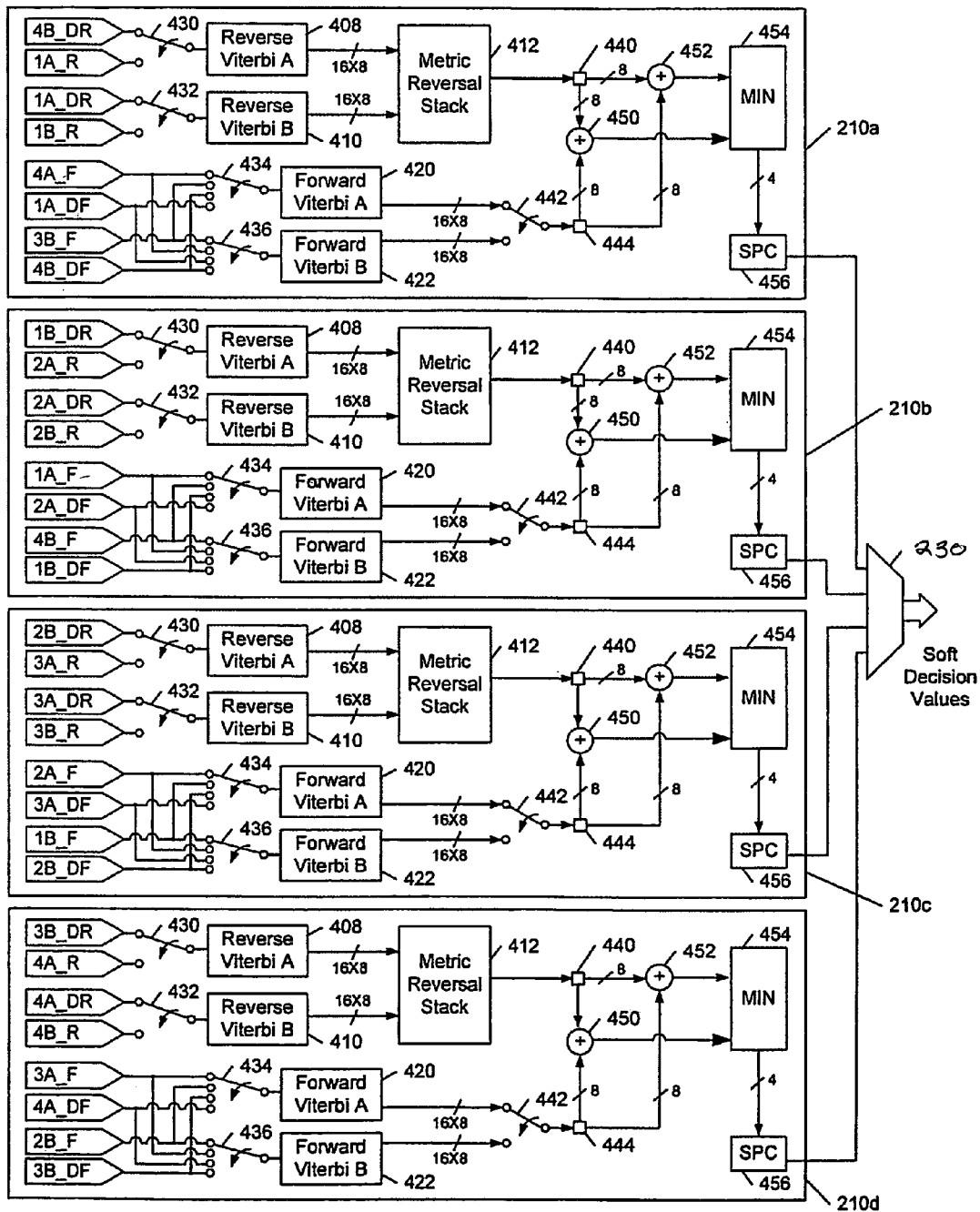

Referring now to FIGS. 1, 2a and 2b, a MAP detector system includes a controller 202 and N=4 MAP detectors 210a-210d that operate in an on-the-fly mode to process input sampled data sequences supplied over input line 214. As is known by those skilled in the art, the MAP detector produces soft decision data. The data are then supplied through a multiplexer 230 to a decoder 232, which determines if the data are error-free or include a correctable number of errors. In on-the-fly operations, the MAP detector system operates in the manner described in the patent application incorporated herein by reference, to supply the soft decision data to the decoder. The decoder then operates in a known manner to further decode the soft decision data and, if possible, produce error-free hard data by correcting any detected errors.

The four MAP detectors 210a-d are each supplied three C length input sampled data sequences from a sample buffer 240 and operate, in parallel, to produce on-the-fly soft decision data for the sequences. Thus, the MAP detector 210a is supplied input sampled data that consists of first, second and third C length data sequences, the MAP detector 210b is supplied input sampled data that consists of second, third and fourth C length data sequences, the MAP detector 210c is supplied input sampled data that consists of third, fourth and fifth sequences, and MAP detector 210d is supplied input sampled data that consists of fourth, fifth and sixth C length data sequences. After the sequences are processed, the MAP detector 210a is next supplied fifth, sixth and seventh C length input sampled data sequences, the MAP detector 210b is supplied sixth, seventh and eighth input sampled data sequences, and so forth. Between the processing of the first, second and third sequences and the unrelated fifth, sixth and seventh sequences, the MAP detector 210a is reset by the controller 202, with the other MAP detectors being reset in a similar manner at appropriate times.

Figure 3:
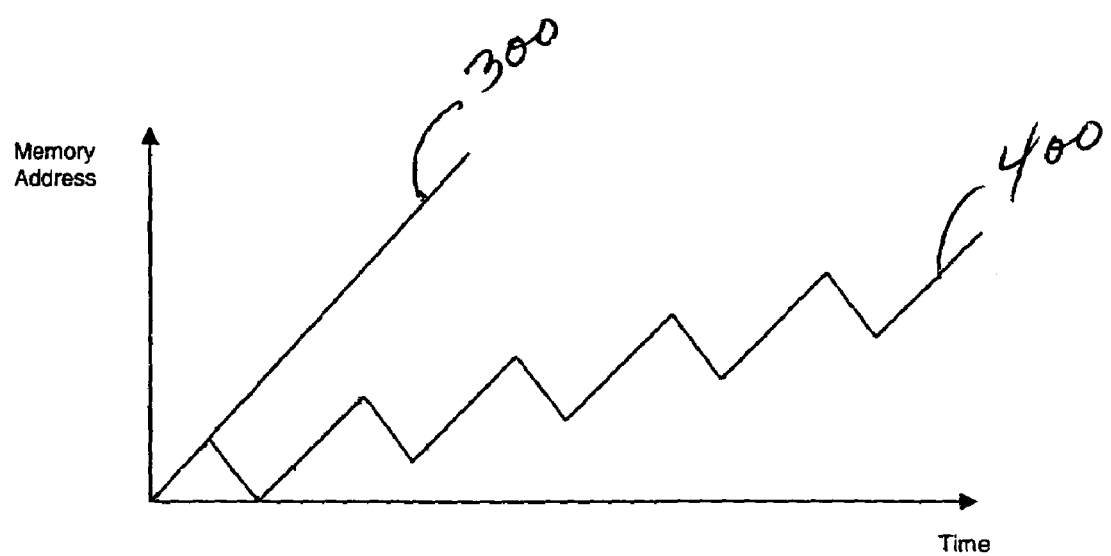
FIG. 3 is a diagram of an address scheme used in connection with serial detector operations.

The sample buffer addressing scheme for the on-the-fly mode is essentially the incremented output of an incrementer/decrementer 242 that provides an address "count" which sequentially and in order addresses the buffer locations, or operates in what can be thought of as a linear manner (represented in FIG. 3 by a function denoted by numeral 300). The address count thus increments to provide the sampled data over path 214 in the same order the data were supplied to the buffer locations, i.e., from the start of the block at a first memory location to the end of the block at a last memory location.

The input sampled data are provided from the addressed locations to data input paths 250 in the respective MAP detectors 210a-d. The data input paths produce serial bit streams that correspond to the C length sequences that are provided as parallel bits from the respective buffer locations. The data input paths produce one stream that consists of the bits in a forward order and another bit stream that consists of the bits in a reverse order by, for example, using the bits directly from a parallel-to-serial converter 400 and from an associated LIFO stack 404, respectively. As appropriate for further processing, one or both of the bit streams are also delayed through delay circuits 402 and 406 in the data input paths. A more detailed discussion of the operations of the data input path is provided in the application incorporated herein by reference.

The bit streams are next processed in parallel by the respective MAP units within the MAP detectors 210a-d. The MAP units utilize, respectively, forward Viterbi operator 420 and two associated reverse Viterbi operators 408 and 410, and forward Viterbi operator 422 and the two reverse Viterbi operators. Each MAP unit 200 processes the three C length bit sequences and produces corresponding C length soft decision data that are then supplied through the multiplexer 230 to the decoder. The operations of the various switches 430, 432, 434, 436, 442, stacks 412 and so forth depicted in the drawings are discussed in the application incorporated herein by reference.

When the soft decision data does not converge, that is, when the decoder can not produce error-free hard data from the soft decision data, the MAP detector system under the control of the controller 202 switches to a non real-time serial error recovery mode. In the serial error recovery mode, the input sampled data are stored in the buffer 240 and are thereafter supplied from the buffer to a selected forward Viterbi operator and its associated two reverse Viterbi operators (referred to hereinafter as "the selected Viterbi operators") as C length bit sequences that are provided in sequential order, such that the selected forward Viterbi operator operates over the entire block of data serially and in order. The selected reverse Viterbi operators process the block of data in a similar manner to the parallel mode. The first selected reverse Viterbi operator is supplied input sampled data that consists of first and second C length data sequences. The first reverse Viterbi operator trains on the second C length sequence and produces metrics corresponding to the first C length sequence. The second selected reverse Viterbi operator is supplied input sampled data that consists of second and third C length data sequences. The second Viterbi operator trains on the third C length sequence and produces metrics corresponding to the second C length sequence. The first selected reverse Viterbi operator is next supplied input sampled data that consists of third and fourth C length data sequences. Between the processing of the first and second sequences and the processing of the third and fourth sequences, the reverse Viterbi operator is reset as the sequences are unrelated due to reverse order processing. The second selected reverse Viterbi operator is next supplied input sampled data that consists of fourth and fifth sequences, and the second reverse Viterbi operator is reset between the processing of the second and third sequences and the fourth and fifth sequences because of the reverse order processing. In this mode, the selected Viterbi operators produce the soft decision data that are supplied through the multiplexer 230 to the decoder.

During the serial mode, a state machine 280 controls the addressing of the sample buffer 240, such that the input sampled data are provided to the selected forward Viterbi operator in the order in which the data are stored in the buffer. The selected forward Viterbi operator is reset at the start of the serial error recovery mode and operates without resetting for the duration of the error recovery operations, since the states of the forward operator at the start of each C length sequence is appropriate for the soft decision decoding of the next sequence. In this way, the selected forward Viterbi operator essentially processes an extended sequence of bits that is sufficiently long to correctly decode included patterns of near pathological data.

The operations of the state machine 280 are discussed below also with reference to FIG. 3. As the start of the serial error recovery operation, the state machine 280 controls the addressing of the buffer 240 to provide to the data input path for the selected Viterbi operators a first C length sequence for processing. Since the selected Viterbi operators start at a known state, there is no need to process two C length sequences in the first, or learning, operation. Thereafter, the state machine controls the addressing of the buffer to provide first, second and third C length sequences to the selected Viterbi operators. Thus, the state machine increments the addressing count of the incremeter/decrementer 242 in the same manner as it operates during the first cycles of a parallel mode operation. While the selected Viterbi operators are processing the first, second and third C length sequences, the state machine continues to increment the addressing count for a total of (5*C)/N clock cycles, assuming a parallelism of N=4, that is, that the MAP detector system includes 4 MAP detectors operating in parallel on three C length sequences each, to provide the next three C length sequences to the subsequent non-selected Viterbi operators, and so forth. As discussed, the results produced by these non-selected operators are not included in the serial error recovery operations, and thus, the results are not passed through the multiplexer 230.

Thereafter, the state machine, for the next (3*C)/N cycles, decrements the address count such that certain of the non-selected Viterbi operators are provided with input sampled data sequences that are read from the buffer locations in the reverse order. However, since the results produced by the non-selected Viterbi operators are not used in the serial error recovery mode, it makes no difference what input sampled data these particular non-selected Viterbi operator process. At the next clock cycle, which corresponds to the time at which the input sampled data are next supplied to the selected Viterbi operators, the controller 210 suppresses the reset signal for the selected forward Viterbi operator and the state machine 280 again increments the address count of the incrementer/decrementer 242. The incremented count now corresponds to the addresses for the locations of the third and then the fourth and fifth C length sequences in the buffered data. The selected forward Viterbi operator is thus provided the third and fourth C length sequences immediately after processing the first and second C length sequences.

This is in contrast to the parallel operations in which the selected forward Viterbi operator would be next processing the fifth and sixth C length sequences. The addressing count for the serial error recovery mode can thus be thought of a sawtooth shape as depicted in FIG. 2 and denoted by reference numeral 400.

The state machine 280 continues incrementing the address count for a total of (5*C)/N clock cycles and decrements the address count for (3*C)/N cycles. At the next clock cycle the controller again suppresses the reset signal to the selected forward Viterbi operator and the state machine 280 increments the address count to supply to the selected Viterbi operators the three C length sequences that sequentially follow the sequences that were just processed by the operators. In this way, the selected forward Viterbi operator serially processes the entire block of data, in order, without the resetting of the operator, and thus, the selected forward Viterbi operator processes a sufficiently long (extended) sequence of bits to correctly decode included near pathological data into soft decision data patterns that the decoder can iteratively decode to convergence.

The particular addressing scheme discussed above is an example of an efficient mechanism that is readily implemented by replacing an incrementing address counter with an incrementing/decrementing address counter and using a state machine to control the timing of the incrementing and decrementing. Alternatively, any addressing schemes may be employed that supply to the selected Viterbi operators the entire data block in sequential C length sequences. In deed, any addressing scheme is appropriate that replaces the data that would be provided to the selected Viterbi operators in a parallel operation with what is next sequentially in the data block. Further, the resetting signals to the non-selected Viterbi operators may but need not be suppressed during the serial error recovery operations.

What is claimed is:

1. A MAP detector system including:
   A. a plurality of Viterbi operators;
   B. a controller for operating the system in a parallel mode in which the results produced by the plurality of Viterbi operators are used as soft decision data, and in a serial error recovery mode in which the results produced by a selected set of the Viterbi operators are used as the soft decision data;
   C. a buffer for retaining input sampled data;
   D. buffer addressing means for controlling the supplying of input sampled data to the plurality of Viterbi operators, the addressing means providing C length sequences of data in the order in which the data are supplied to the buffer to the plurality of Viterbi operators in the parallel mode and to the selected set of Viterbi operators in the serial error recovery mode.

2. The MAP detector system of claim 1 wherein the controller in the serial error recovery mode refrains from resetting the selected forward Viterbi operator.

3. The MAP detector system of claim 1 wherein the controller in the parallel mode periodically resets the plurality of Viterbi operators.

4. The MAP detector system of claim 1 wherein the buffer addressing means includes an incrementer/decrementer that increments and decrements an address count during the serial error recovery mode.

5. The MAP detector system of claim 4 wherein the incrementer/decrementer increments the address count during the parallel mode.

6. A method of operating a MAP detector system including the steps of:
   a. operating a plurality of Viterbi operators in parallel to produce on-the-fly soft decision data for a block of input sampled data;
   b. if the soft decision data does not converge, operating the plurality of Viterbi operators in a serial error recovery mode in which a selected set of one forward and two reverse Viterbi operators produce the soft decision data for the entire block.

7. The method of operating the MAP detector system of claim 6 further including, in the step of operating the plurality of Viterbi operators in the serial error recovery mode, providing the block of input sampled data to the selected set of Viterbi operators as an in order sequence of C length data sequences without resetting the selected forward Viterbi operator.

8. The method of operating the MAP detector system of claim 7 further including, in the step of providing the block of input sampled data, addressing locations of a buffer containing the input sampled data in the order in which the data are supplied to the buffer for a first predetermined number of clock cycles that starts with a clock cycle in which data are supplied to the selected set of Viterbi operators and in a reverse order for a second predetermined number of clock cycles that ends one clock cycle before data are again supplied to the selected set of Viterbi operators.

* * * * *

UNITED STATES PATENT AND TRADEMARK OFFICE
CERTIFICATE OF CORRECTION

PATENT NO. : 7,650,561 B1  Page 1 of 1
APPLICATION NO. : 11/484462
DATED : January 19, 2010
INVENTOR(S) : Ulriksson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 861 days.

Signed and Sealed this

Twenty-third Day of November, 2010

David J. Kappos
*Director of the United States Patent and Trademark Office*